United States Patent
Hara et al.

(10) Patent No.: US 7,602,101 B2
(45) Date of Patent: Oct. 13, 2009

(54) PIEZOELECTRIC THIN-FILM RESONATOR AND FILTER USING THE SAME

(75) Inventors: Motoaki Hara, Kawasaki (JP); Tokihiro Nishihara, Kawasaki (JP); Masanori Ueda, Kawasaki (JP); Go Endo, Yokohama (JP)

(73) Assignees: Fujitsu Media Devices, Yokohama (JP); Fujitsu LImited, Kawasaki (JP)

( * ) Notice: Subject to any disclaimer, the term of this patent is extended or adjusted under 35 U.S.C. 154(b) by 8 days.

(21) Appl. No.: 11/976,608

(22) Filed: Oct. 25, 2007

(65) Prior Publication Data

US 2008/0143215 A1    Jun. 19, 2008

(30) Foreign Application Priority Data

Oct. 25, 2006    (JP)    ............................. 2006-290495

(51) Int. Cl.
    *H01L 41/047*    (2006.01)
(52) U.S. Cl. ................... 310/320; 310/324; 310/365; 333/187; 333/189
(58) Field of Classification Search ............... 310/320, 310/321, 324, 365; 333/187, 189
    See application file for complete search history.

(56) References Cited

U.S. PATENT DOCUMENTS

| | | | | |
|---|---|---|---|---|
| 6,396,200 B2 * | 5/2002 | Misu et al. | ................. | 310/348 |
| 6,657,363 B1 * | 12/2003 | Aigner | ................. | 310/324 |
| 7,199,510 B2 * | 4/2007 | Umeki | ................. | 310/365 |
| 7,463,117 B2 * | 12/2008 | Ohara et al. | ................. | 333/187 |
| 7,482,737 B2 * | 1/2009 | Yamada et al. | ................. | 310/363 |
| 7,498,717 B2 * | 3/2009 | Yokoyama et al. | ................. | 310/320 |
| 2003/0107456 A1 | 6/2003 | Nishihara et al. | | |
| 2004/0017269 A1 * | 1/2004 | Gotoh et al. | ................. | 333/133 |
| 2006/0048358 A1 | 3/2006 | Morimura et al. | | |
| 2008/0179995 A1 * | 7/2008 | Umeda et al. | ................. | 310/324 |
| 2009/0033177 A1 * | 2/2009 | Itaya et al. | ................. | 310/335 |

FOREIGN PATENT DOCUMENTS

| | | |
|---|---|---|
| JP | 60-189307 A | 9/1985 |
| JP | 2006-109402 A | 4/2006 |
| JP | 2006-128993 A | 5/2006 |
| KR | 2003-0035784 A | 5/2003 |

OTHER PUBLICATIONS

ZnO/SiO$_2$—Diaphragm Composite Resonator on a Silicon Wafer, Electronics Letters, Jul. 9, 1981, vol. 17, No. 14, pp. 507-509.

* cited by examiner

*Primary Examiner*—Thomas M Dougherty
(74) *Attorney, Agent, or Firm*—Arent Fox LLP

(57) ABSTRACT

A piezoelectric thin-film resonator includes: a lower electrode supported by a substrate, a space being defined below the lower electrode; a piezoelectric film provided on the lower electrode and the substrate; and an upper electrode provided on the piezoelectric film so as to form a resonance portion in which the upper electrode faces the lower electrode across the piezoelectric film. At least one of the lower electrode and the upper electrode has an interconnection portion used to extract a signal from the resonance portion and located above the space. The at least one of the lower electrode and the upper electrode has a first mass per unit area in which the at least one of the lower electrode and the upper electrode contacts the piezoelectric film and a second mass per unit area in the resonance portion. The first mass per unit area is smaller than the second mass per unit area.

7 Claims, 18 Drawing Sheets

PIEZOELECTRIC THIN-FILM RESONATOR AND FILTER USING THE SAME

BACKGROUND OF THE INVENTION

1. Field of the Invention

The present invention relates to a piezoelectric thin-film resonator and a filter using the same, and more particularly, to a piezoelectric thin-film resonator having a space located below a resonance portion in which an upper electrode and a lower electrode face each other across a piezoelectric film and a filer using the same.

2. Description of the Related Art

There has been an increasing demand for compact and lightweight resonators and filters using such resonators due to rapid spreading of wireless equipment such as cellular phones. In the past, dielectric filters and surface acoustic wave (SAW) filters were used. Recently, there has been a considerable activity in the research and development of a piezoelectric thin-film resonator that can be miniaturized and monolithically manufactured and a filter using such a resonator.

An FBAR (Film Bulk Acoustic Resonator) type resonator is known as one of the piezoelectric thin-film resonators. The FBAR has a film laminate composed of an upper electrode, a piezoelectric film and a lower electrode. A space, which may be a via hole or cavity, is provided below the lower electrode and located within an overlapping region (resonance portion) in which the upper and lower electrodes overlap with each other across the piezoelectric film. The space may be formed below a dielectric film provided under the lower electrode. The via hole may be defined by wet-etching a silicon substrate that may be used as a device substrate from the backside of the silicon substrate. The cavity may be defined by forming the resonator composed of the film laminate on a sacrificed layer on the surface of the substrate and removing the sacrificed layer. In this manner, the piezoelectric thin-film resonators are of via-hole type and cavity type.

A high-frequency signal is applied between the upper electrode and the lower electrode, an acoustic wave is generated within the piezoelectric film sandwiched between the upper and lower electrodes. The acoustic wave thus generated is excited by the reverse piezoelectric effect and distortion arising from the piezoelectric effect. The acoustic wave is totally reflected by the surface of the upper electrode (film) that is in contact with air and the surface of the lower electrode (film) that is in contact with air. Thus, the acoustic wave is a thickness-extensional wave having main displacements in the thickness direction. In the present device structure, a resonance takes place at a frequency at which the total thickness H of the thin-film laminate structure composed of the upper electrode/piezoelectric film/lower electrode located above the opening is equal to an integer multiple of the ½ wavelength of the acoustic wave. The propagation velocity V of the acoustic wave is determined by the material used, and the resonant frequency F is written as $F=nV/2H$. By utilizing the resonant phenomenon, it is possible to control the resonant frequency with the thickness being used as a parameter for control and to realize the resonators and filters having desired frequency responses.

The upper and lower electrodes may be a film laminate made of a metal such as aluminum (Al), copper (Cu), molybdenum (Mo), tungsten (W), tantalum (Ta), platinum (Pt), ruthenium (Ru), rhodium (Rh), iridium (Ir), chromium (Cr), or titanium (Ti), or an arbitrary combination of these metals. The piezoelectric film may be aluminum nitride (AlN), zinc oxide (ZnO), lead zirconate titanate (PZT), or lead titanate ($PbTiO_3$). Preferably, the piezoelectric film is aluminum nitride or zinc oxide having an orientation axis in the (002) direction. The device substrate may be made of silicon (Si), glass or gallium arsenide (GaAs).

As described above, the piezoelectric thin-film resonator having the above-mentioned structure is required to have a via hole or cavity just below the lower electrode (or a dielectric film). In the following description, the via hole is defined as a hole that penetrates the device substrate and connect the upper and lower surfaces thereof, and the cavity is defined as a hole provided in the vicinity of the surface or just below the lower electrode.

FIG. 1 is a cross-sectional view of a conventional piezoelectric thin-film resonator described in Electron. Lett., 1981, vol. 17, pp. 507-509 (hereinafter referred to as Document 1). A laminate structure is provided on a (100) silicon substrate 11 having a thermal oxide film ($SiO_2$), and is composed of a lower electrode 13 that is an Au—Cr film, a piezoelectric film 14 that is a ZnO film, and an upper electrode 15 that is an aluminum film. A via hole 16 is formed below the film laminate. The via hole 16 may be formed by anisotropic etching using KOH or EDP (ethylenediamine and pyrocatechol) from the backside of the (100) silicon substrate 11.

FIG. 2 is a cross-sectional view of a conventional piezoelectric thin-film resonator of the cavity type disclosed in Japanese Patent Application Publication No. 60-189307 (Document 2). A film laminate is composed of a lower electrode 23, a piezoelectric film 24 and an upper electrode 25 provided on a device substrate 21 having a thermal oxide film ($SiO_2$) 22. A cavity 26 is defined below the film laminate. The cavity 26 may be formed by patterning an island-like sacrificed layer of ZnO, forming the film laminate on the sacrificed layer, and removing the sacrificed layer located below the film laminate by acid.

The piezoelectric thin-film resonators mentioned above have resonance portions in which the upper electrodes 15 and 25 face the lower electrodes 13 and 23 across the piezoelectric films 14 and 24. Vibration energy is confined in the resonance portions so that a high quality factor Q can be realized. Japanese Patent Application Publication No. 2006-128993 (Document 3) shows a technique shown in parts (a) through (c) of FIG. 3. Vibration media (which include a lower electrode 33, a piezoelectric film 34 and an upper electrode 35) in the vicinity of a resonance portion 37 formed on a substrate 31 having a cavity 36. Removal of the vibration media increases a high quality factor Q.

Even in the resonator disclosed in Document 2, vibration energy may be scattered and lost through an upper electrode 35b in an interconnection portion 38 for extracting a signal from an upper electrode 35a of the resonance portion 37 and through the piezoelectric film 34 below the upper electrode 35b. This degrades the quality factor Q. Removal of the piezoelectric film 34 in the interconnection portion 38 restrains scattering and losing of the vibration energy of the resonance portion 37. However, the removal of the piezoelectric film 34 in the interconnection portion 38 complicates the manufacturing process of the piezoelectric thin-film resonator.

SUMMARY OF THE INVENTION

The present invention has been made in view of the above circumstances and provides a piezoelectric thin-film resonator capable of restraining scattering and losing vibration energy from a resonance portion through a simple manufacturing process and a filter using the same.

According to an aspect of the present invention, there is provided a piezoelectric thin-film resonator including: a lower electrode supported by a substrate, a space being defined below the lower electrode; a piezoelectric film provided on the lower electrode and the substrate; and an upper electrode provided on the piezoelectric film so as to form a resonance portion in which the upper electrode faces the lower electrode across the piezoelectric film, at least one of the lower electrode and the upper electrode having an interconnection portion used to extract a signal from the resonance portion and located above the space, said at least one of the lower electrode and the upper electrode having a first mass per unit area in which said at least one of the lower electrode and the upper electrode contacts the piezoelectric film and a second mass per unit area in the resonance portion, the first mass per unit area being smaller than the second mass per unit area.

According to another aspect of the present invention, there is provided a filter composed of resonators including a resonator configured as described above.

BRIEF DESCRIPTION OF THE DRAWINGS

Preferred embodiments of the present invention will be described in conjunction with the accompanying figures, in which.

DESCRIPTION OF THE PREFERRED EMBODIMENTS

A description will now be given of embodiments of the present invention with reference to the accompanying drawings.

First Embodiment

Figure 1:
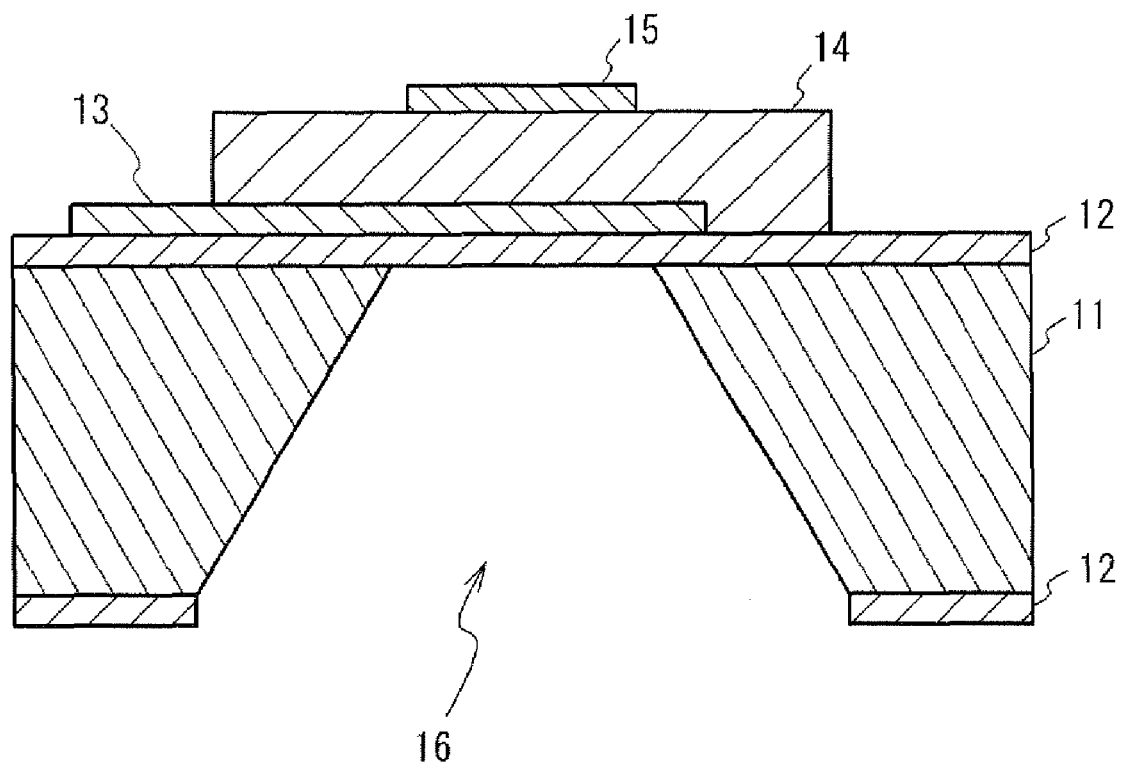
FIG. 1 is a cross-sectional view of a conventional piezoelectric thin-film resonator.
Figure 2:
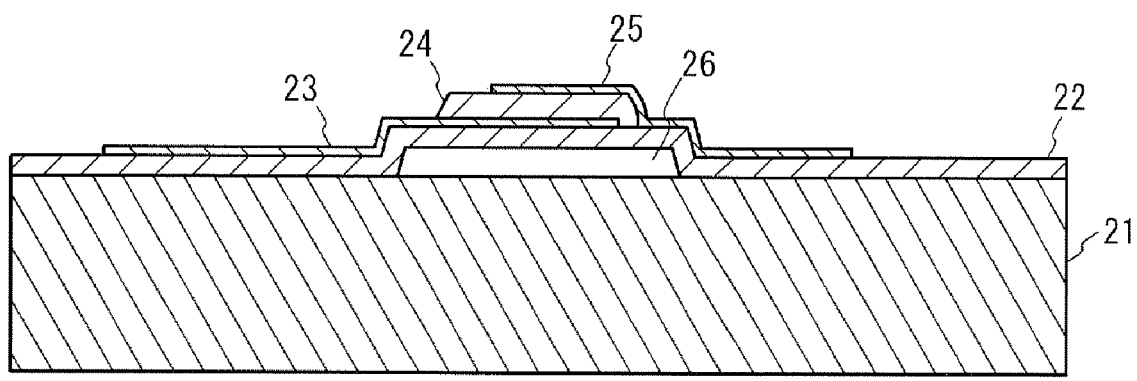
FIG. 2 is a cross-sectional view of another conventional piezoelectric thin-film resonator.
Figure 3:
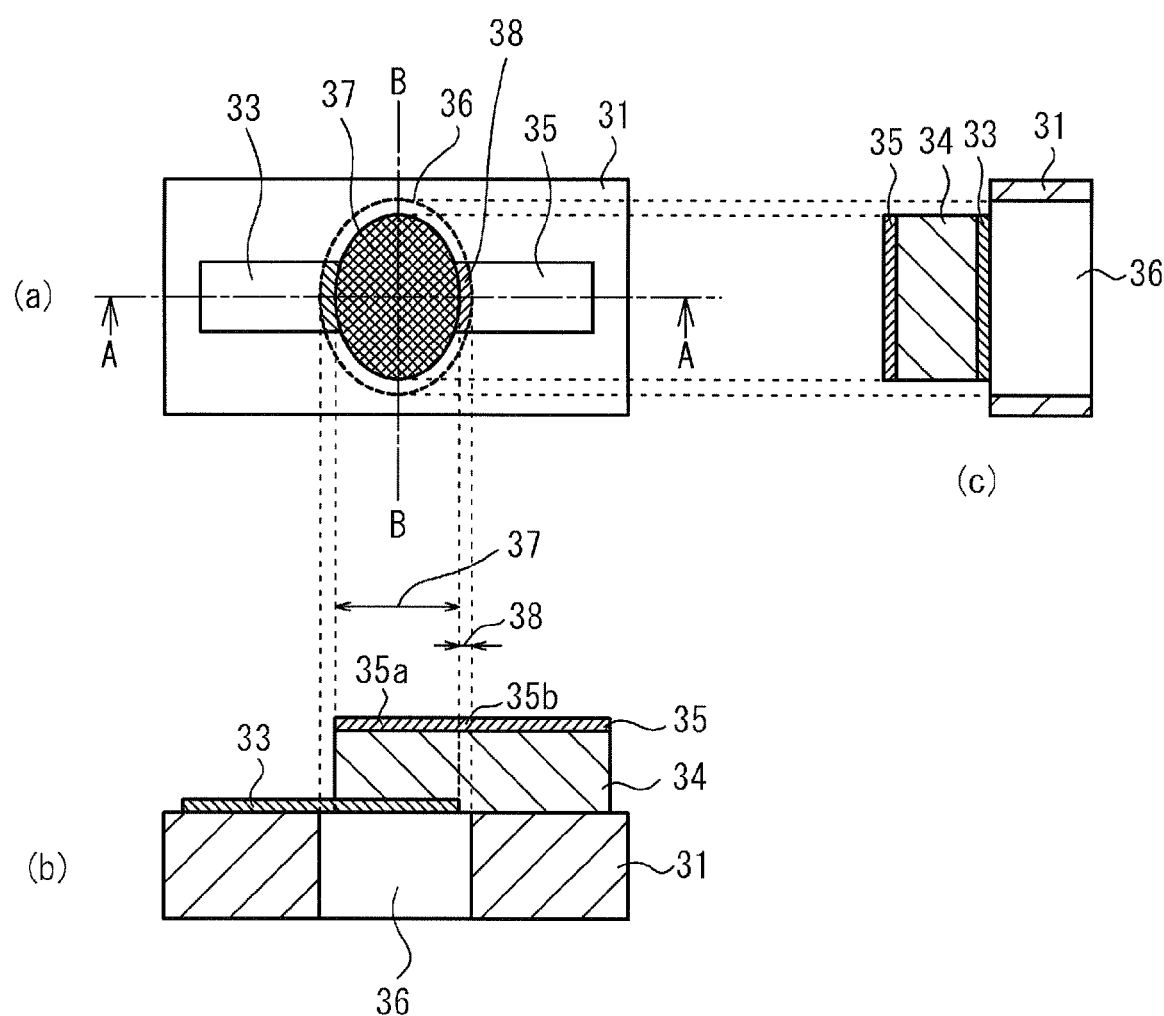
FIG. 3 shows a plan view of yet another conventional piezoelectric thin-film resonator in part (a) and shows, in part (b), a cross-sectional view taken along a line A-A in part (a)
Figure 4:
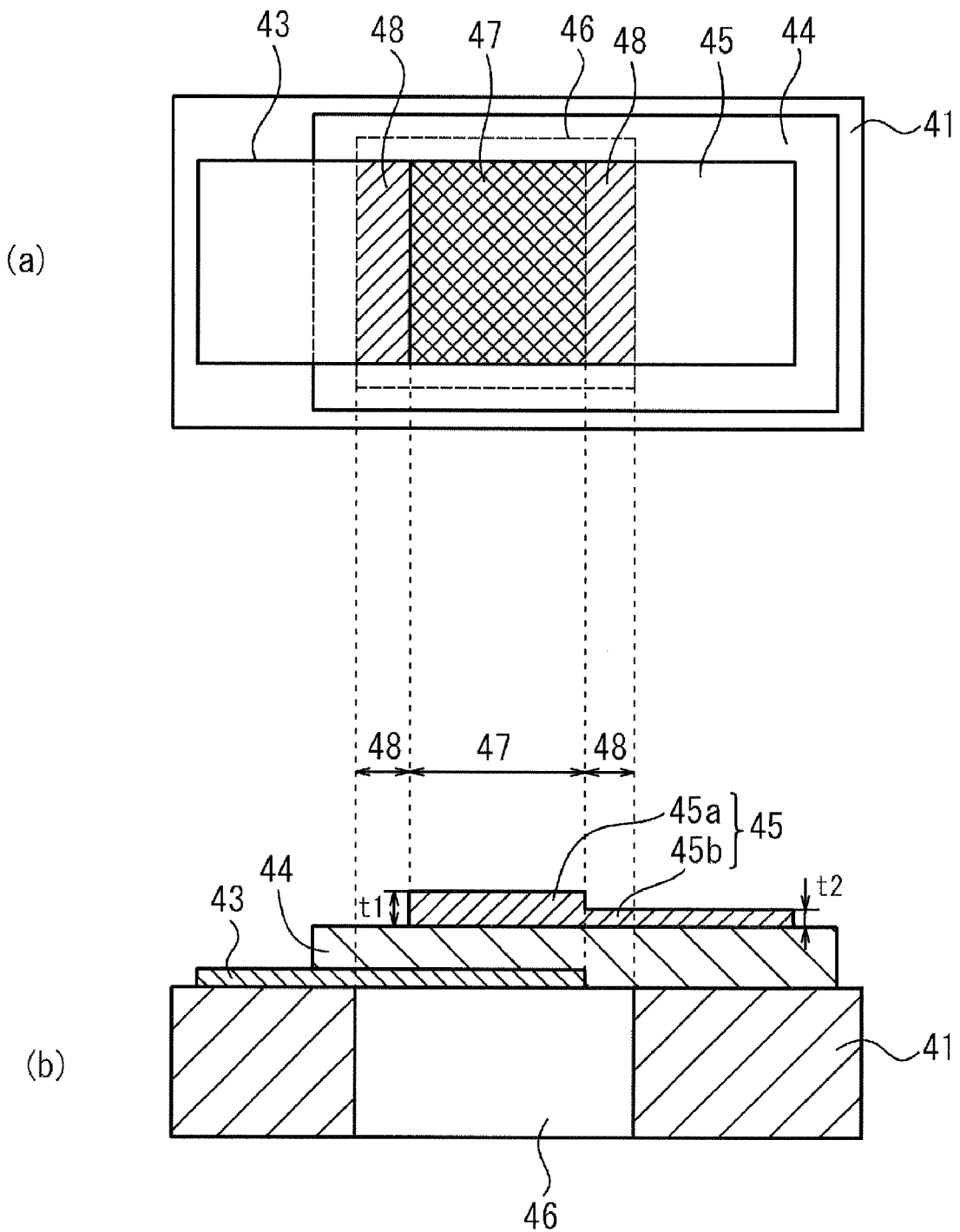
FIG. 4 has part (a) that is a plan view of a piezoelectric thin-film resonator in accordance with a first embodiment and part (b) that is a cross-sectional view.

Part (a) of FIG. 4 is a plan view of a piezoelectric thin-film resonator in accordance with a first embodiment, and part (b) of FIG. 4 is a cross-sectional view thereof. Referring to FIG. 4, a lower electrode 43 made of ruthenium (Ru) is formed on a silicon substrate 41 having a via hole 46. A piezoelectric film 44 made of aluminum nitride (AlN) is formed on the lower electrode 43 and the silicon substrate 41. An upper electrode made of Ru is formed on the piezoelectric film 44. A resonance portion 47 is a region in which an upper electrode 45 and a lower electrode 43 face each other across the piezoelectric film 44. The lower electrode 43 and the upper electrode 45 have interconnection portions 48 for extracting signals from the resonance portion 47 located above the via hole 46. An upper electrode 45b in the interconnection portion 48 has a film thickness t2 smaller than a film thickness t1 of an upper electrode 45a in the resonance portion 47. For example, the upper electrode 45a is approximately 250 nm thick, and the piezoelectric film 44 is approximately 1 μm thick. Further, the upper electrode 45a in the resonance portion 47 is approximately 250 nm thick, and the upper electrode 45b of the interconnection portion 48 is approximately 75 nm thick. The resonance portion 47 has a size as large as 50 to 200 μm, and the interconnection portions 48 have a size as large as 1 to 20 μm.

Figure 5A:
FIGS. 5A through 5I are cross-sectional views showing a process of manufacturing the piezoelectric thin-film resonator of the first embodiment.
Figure 5B:
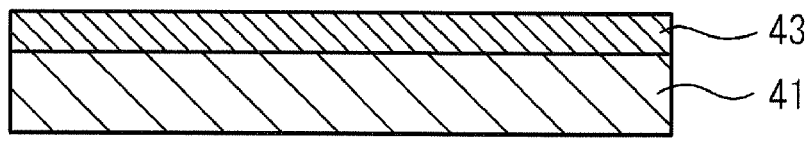
Figure 5C:
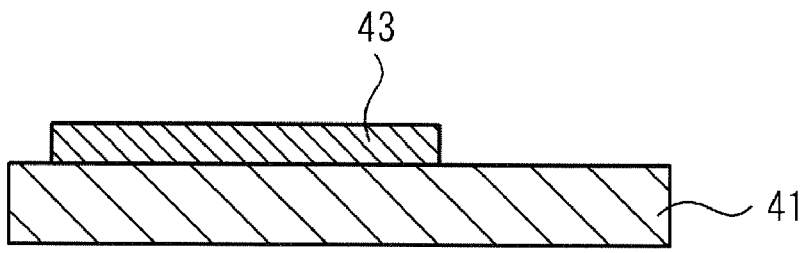
Figure 5D:
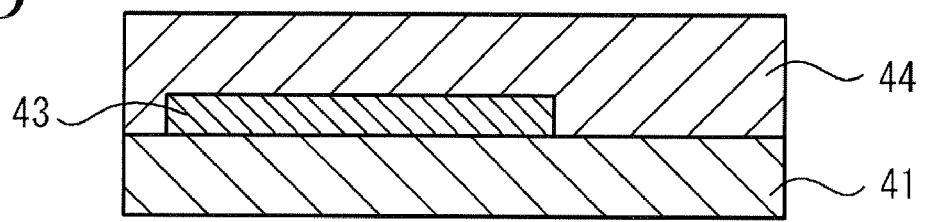

A method for manufacturing the piezoelectric thin-film resonator in accordance with the first embodiment will now be described. FIGS. 5A through 5I schematically show cross-sections of a wafer. Referring to FIG. 5A, the silicon substrate 41 having a (100) cut is prepared. The lower electrode 43 made of Ru and having a thickness of about 250 nm is formed on the silicon substrate 41 by sputtering in an atmosphere of Ar gas at 0.6 to 1.2 Pa. Referring to FIG. 5C, the lower electrode 43 is formed into a predetermined shape by photolithography and etching. Referring to FIG. 5D, the piezoelectric film 44 having a thickness of approximately 1 μm and an orientation of a major axis in the (002) direction is deposited on the lower electrode 43 and the substrate 41 by sputtering in an atmosphere of a Ar/N$_2$ mixture gas at a pressure of approximately 0.3 Pa.

Figure 5E:
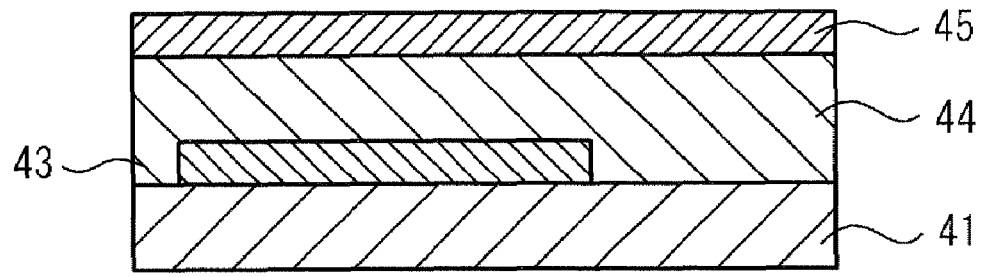
Figure 5F:
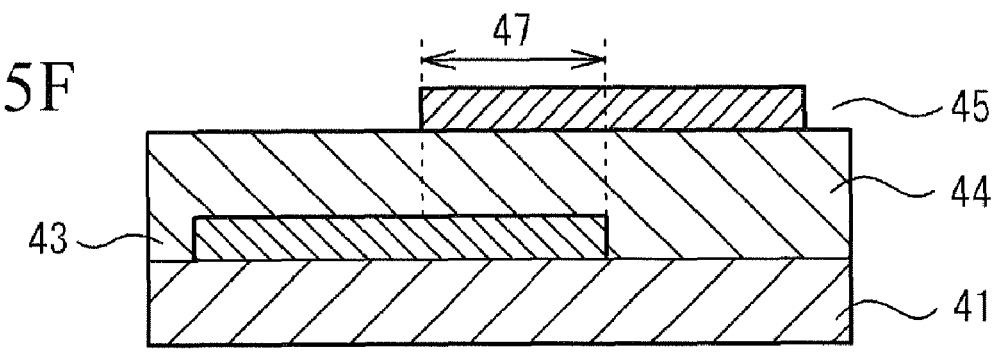
Figure 5G:
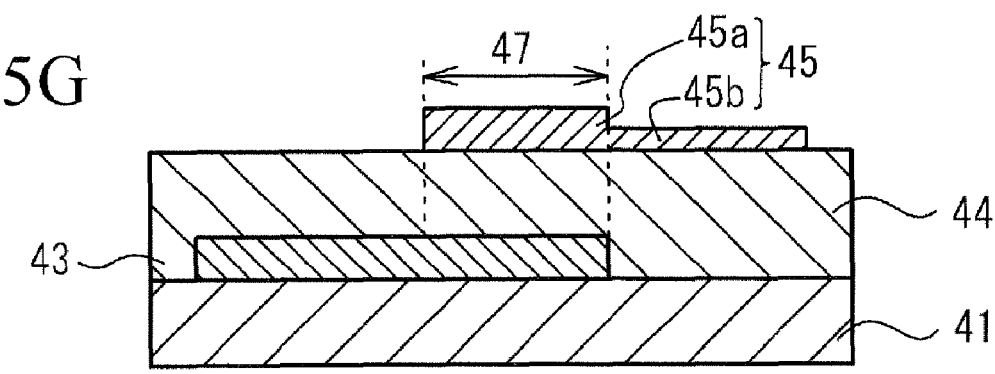

Referring to FIG. 5E, the upper electrode 45 made of Ru and having a thickness of approximately 250 nm is formed on the piezoelectric film 44 by sputtering in an atmosphere of Ar gas at 0.6 to 1.2 Pa. Referring to FIG. 5F, the upper electrode 45 is formed into a predetermined shape by photolithography and etching. The resonance portion 47 is a region in which the lower electrode 43 and the upper electrode 45 face each other across the piezoelectric film 44. Referring to FIG. 5G the upper electrode 45 except the resonance portion 47 is etched and reduced to a thickness of approximately 75 nm.

Figure 5H:
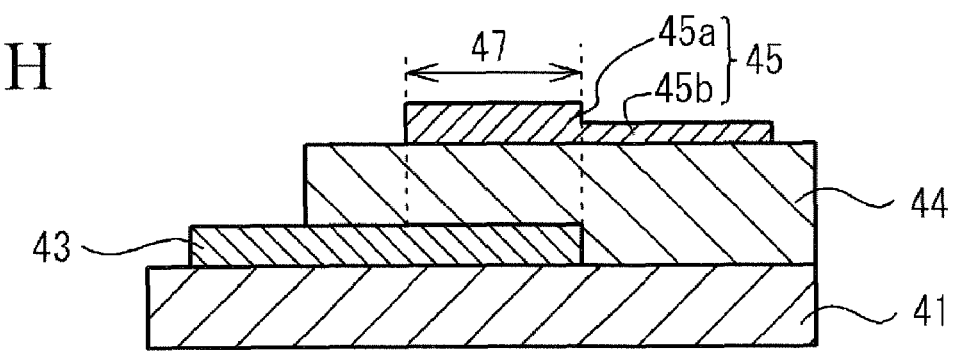
Figure 5I:
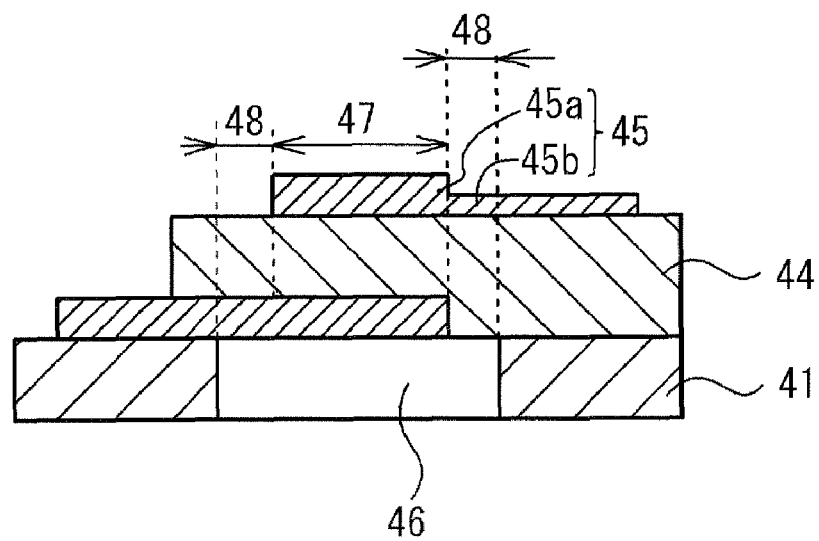

Referring to FIG. 5H, the piezoelectric film 44 is formed into a predetermined shape by photolithography and etching. Referring to FIG. 5I, the substrate 41 is dry-etched from the backside thereof to form the via hole 46 therein so as to laterally include the resonance portion 47. Thus, portions of the lower electrode 43 and the upper electrode 45 that are laterally beyond the resonance portion 47 and are vertically above the via hole 46 are the interconnection portions 48 for extracting the signals from the resonance portion 47.

In FIG. 5A, the substrate 41 may be a quartz substrate, glass substrate or GaAs substrate other than the silicon substrate. In FIGS. 5B and 5E, the lower electrode 43 and the upper electrode may be made of any of the metals described in the background of the invention other than Ru.

Figure 6:
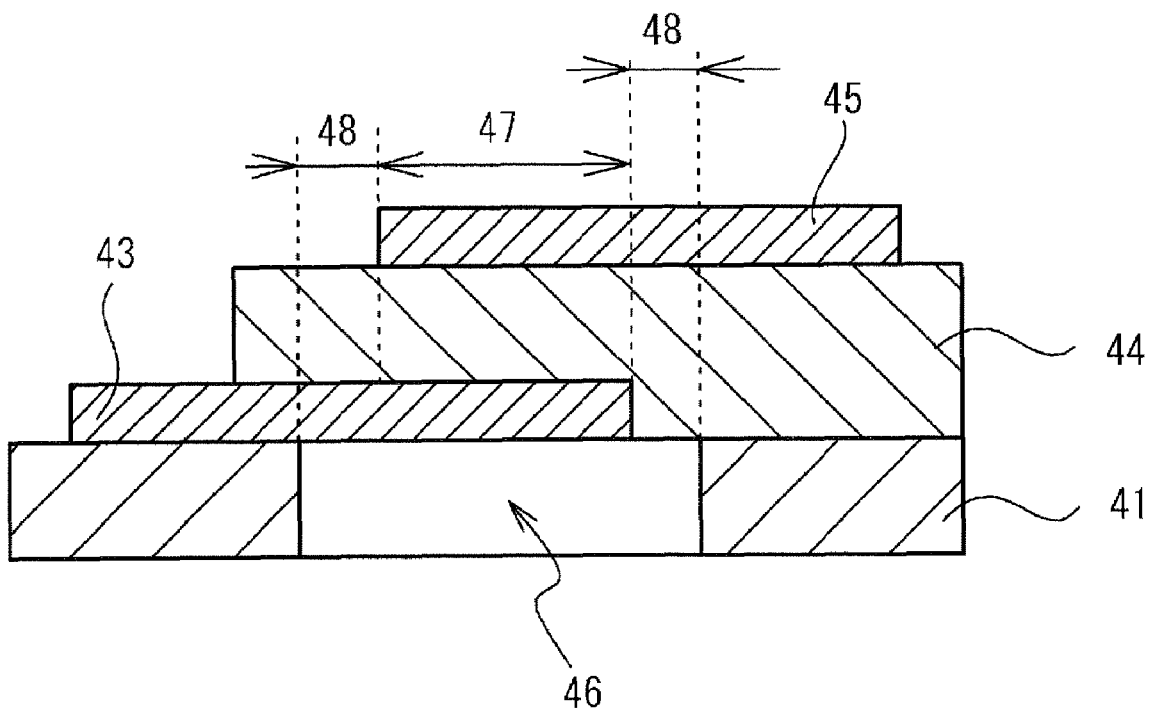
FIG. 6 is a cross-sectional view of a piezoelectric thin-film resonator of a first comparative example.

FIG. 6 schematically shows a cross section of a first comparative example that is to be compared with the first embodiment in performance. Referring to FIG. 6, a piezoelectric thin-film resonator of the first comparative example has the upper electrode 45 that has a uniform thickness in the resonance portion 47 and the interconnection portion 48 and is approximately 250 nm. The other structures of the first comparative example are the same as those of the first embodiment.

Figure 7:
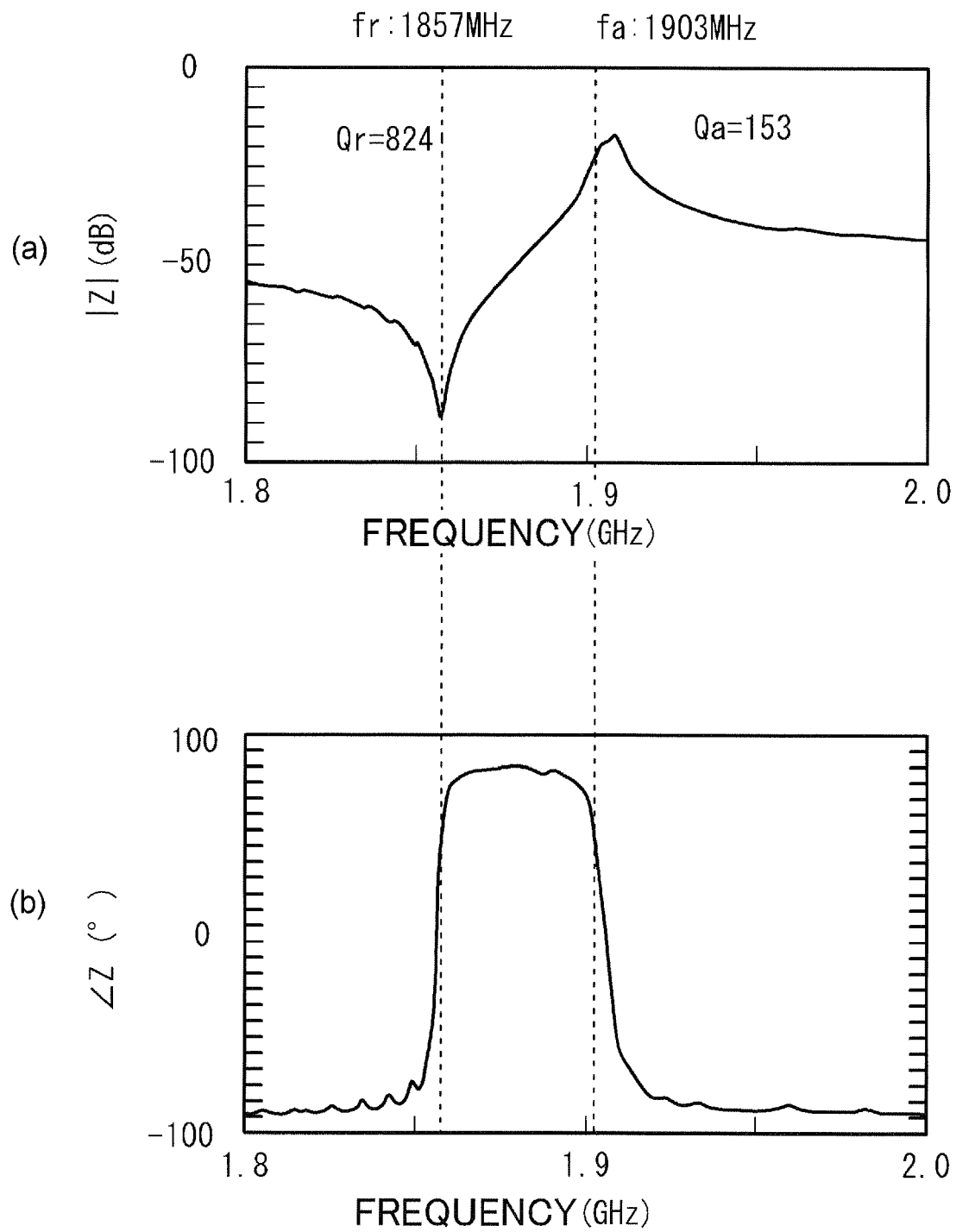
FIG. 7 shows graphs of impedance as a function of frequency in the first comparative example.
Figure 8:
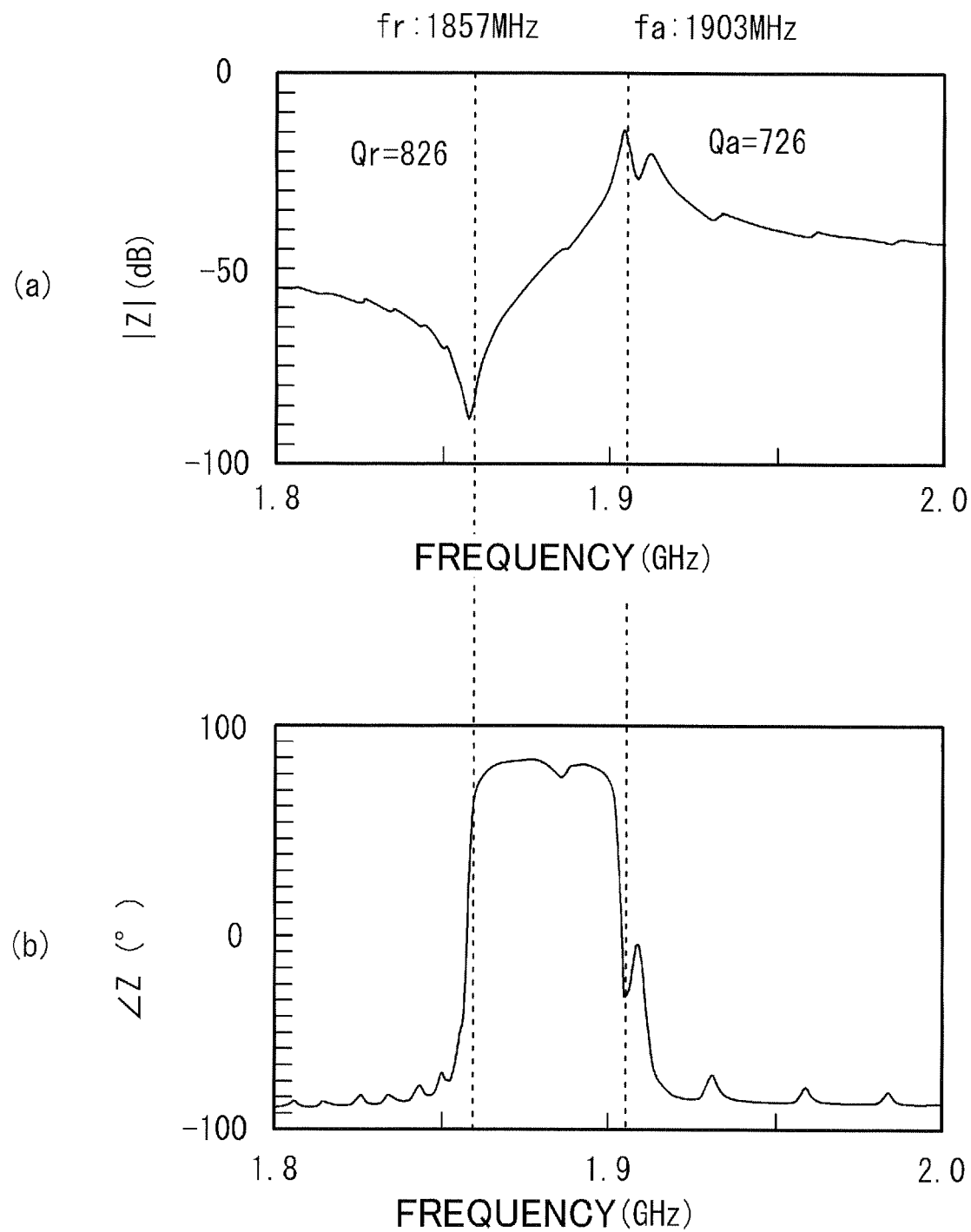
FIG. 8 shows graphs of impedance as a function of frequency in the first embodiment.

The inventors measured the impedances of the piezoelectric thin-film resonators of the first comparative example and the first embodiment. The resonance portions of the piezoelectric thin-film resonators used in the experiment has a size of approximately 62 μm×87 μm, and has the interconnection portions that are approximately 2 μm long. FIG. 7 has parts (a) and (b), which respectively show the magnitude |Z| and angle /_Z of the impedance as a function of the frequency in the first comparative example. FIG. 8 has parts (a) and (b), which respectively show the magnitude |Z| and angle /_Z of the impedance as a function of the frequency in the first embodiment. Referring to part (a) of FIG. 7 related to the first comparative example, the quality factor Qr at the resonance frequency is equal to 824, whereas the quality factor Qa at the anti-resonance frequency is as small as 153. In contrast, as shown in part (a) of FIG. 8 related to the first embodiment, the quality factor Qr at the resonance frequency is equal to 826, and the quality factor Qa at anti-resonance frequency is as great as 762. The first embodiment has an improved quality factor Qa of |Z|, as compared to the first comparative example. Thus, as is shown in part (b) of FIG. 8, the angle /_Z of the impedance at the anti-resonance frequency in the first embodiment changes sharply, as compared to the first comparative example shown in part (b) of FIG. 7. As described above, the first embodiment is capable of improving the quality factor Qa at the anti-resonance frequency.

Figure 9:
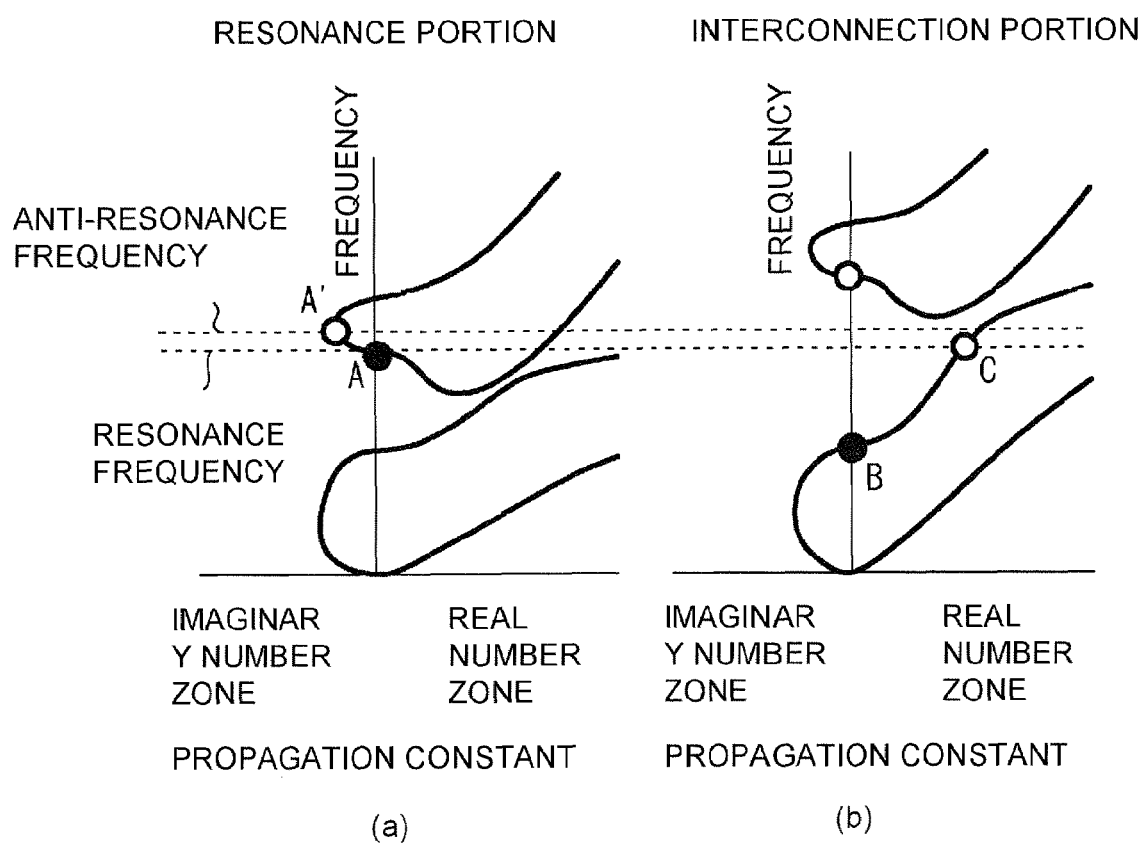
FIG. 9 schematically shows a dispersion characteristic of acoustic wave of the first comparative example.

A description will now be given of the reasons why the quality factor Qa at the anti-resonance frequency can be improved. The inventors calculated dispersion characteristics of vibration modes of acoustic wave in the first comparative example and the first embodiment. FIG. 9 has parts (a) and (b), which respectively show dispersion characteristics of vibration modes of acoustic wave in the resonance portion 47 and the interconnection portions 48 in the first comparative example. The vertical axes of the graphs of parts (a) and (b) of FIG. 9 denote the excited frequency, and the horizontal axes denote the propagation constant of vibration in the lateral direction in each vibration mode with wave number (k). The horizontal axes show two quadrants consisting of the real number zone on the right-hand side and the imaginary number zone on the left-hand side. The acoustic waves at frequencies at which the propagation constant of vibration mode falls within the real number zone are propagated or scattered and lost. The acoustic waves at frequencies at which the propagation constant of vibration mode falls within the imaginary number zone are not propagated or scatted and lost.

Referring to part (a) of FIG. 9 relate to the first comparative example, the frequency at a point A at which the propagation constant is zero between the real number zone and the imaginary number zone is the resonance frequency. The anti-resonance frequency is located at a point A'. Referring to pat (b) of FIG. 9, the dispersion characteristic in the interconnection portions 48 slightly differ from that in the resonance portion 47 because the lower electrode 43 is not provided in the interconnection portions 48. The propagation constant of acoustic wave close to the resonance frequency of the resonance portion 47 is located at a point C within the real number zone. Thus, the vibration energy of acoustic wave that resonates in the resonance portion 47 is scattered to the periphery and lost through the interconnection portions 48. Thus, the quality factor Q is degraded.

Figure 10:
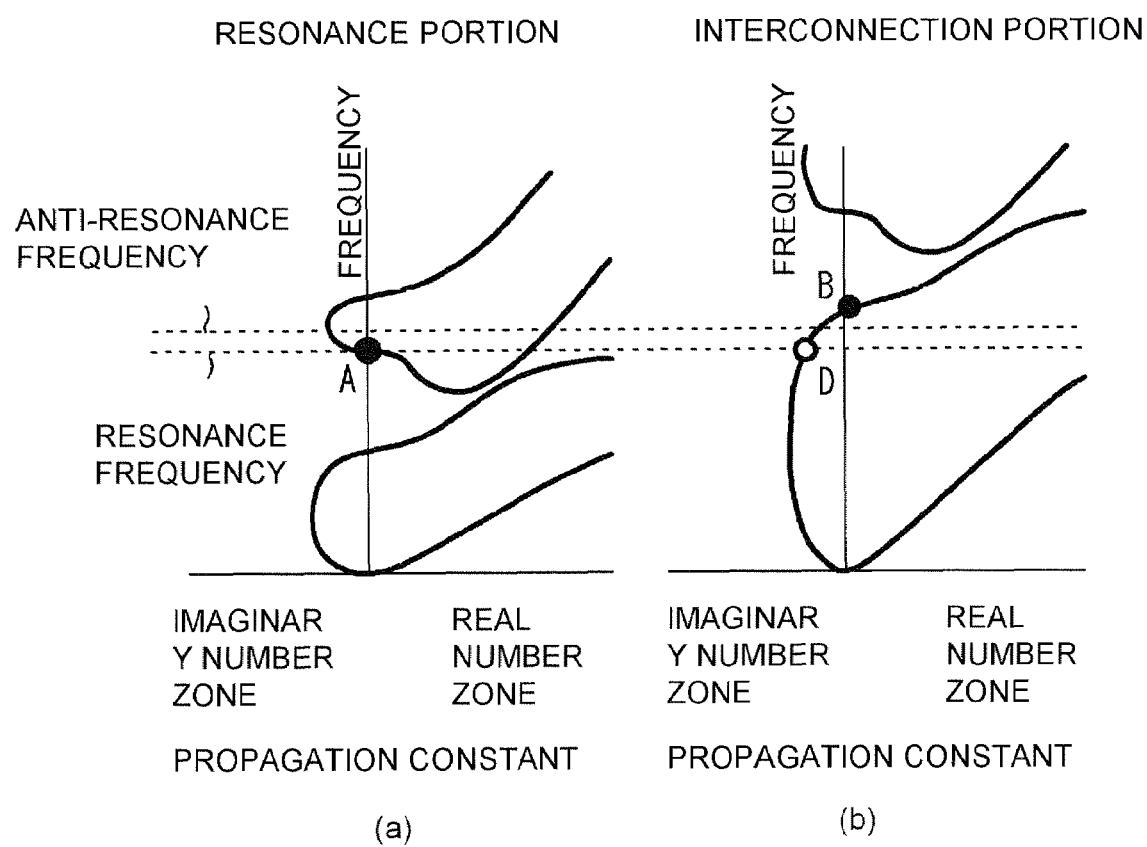
FIG. 10 schematically shows a dispersion characteristic of acoustic wave of the first embodiment.

Parts (a) and (b) of FIG. 10 schematically show vibration modes of acoustic wave in the resonance portion 47 and the interconnection portions 48 of the first embodiment. Referring to part (a) of FIG. 10, the dispersion characteristic in the resonance portion 47 is the same as that in the first comparative example shown in part (a) of FIG. 9. In contrast, the upper electrode 45 in the interconnection portion 48 is thinner than that in the resonance portion 47. Thus, the dispersion characteristic of vibration modes at low frequencies influences that at high frequencies. That is, the cutoff frequency B of the first embodiment is higher than that of the first comparative example. When the cutoff frequency B is higher than the resonance frequency A, the propagation constant of acoustic wave close to the resonance frequency in the resonance portion 47 falls within the imaginary number zone D. Thus, the vibration energy that resonates in the resonance portion 47 is reflected by the interconnection portions 48 and is not scattered to the periphery and lost. It is thus possible to restrain the quality factor from being degraded.

An angular frequency $\omega_A$ at the resonance frequency A in parts (a) of FIGS. 9 and 10 has the following relation.

$$\tan\left(\sqrt{\frac{\rho}{c_{33} + \frac{e_{33}^2}{\varepsilon_{33}}}} \omega_A h\right) = \frac{\left(c_{33} + \frac{e_{33}^2}{\varepsilon_{33}}\right)\sqrt{\frac{\rho}{c_{33} + \frac{e_{33}^2}{\varepsilon_{33}}}} \omega_A}{\omega_A^2 M' + \frac{1}{h}\frac{e_{33}}{\varepsilon_{33}}} \quad (1)$$

An angular frequency $\omega_B$ at the cutoff frequency B in parts (b) of FIGS. 9 and 10 has the following relation.

$$\tan\left(2\sqrt{\frac{\rho}{c_{44}}} \omega_B h\right) = -\frac{\omega_B^2 M''}{c_{44}\sqrt{\frac{\rho}{c_{44}}} \omega_B} \quad (2)$$

In equations (1) and (2), h is the thickness of the piezoelectric film 44, $\rho$ is the density of the piezoelectric film 44, $c_{33}$ and $c_{44}$ are stiffness of the piezoelectric film 44, $e_{33}$ is the piezoelectric constant of the piezoelectric film 44, and $\varepsilon_{33}$ is the dielectric constant of the piezoelectric film 44. Symbols M' and M'' denote the masses of the lower electrode 43 and the upper electrode 45 per unit area loaded onto the piezoelectric film 44 in the resonance portion 47 and the interconnection portion 48, respectively. When the upper electrode 45 is formed by a single layer, M'=$\rho$'$t_1$ and M''=$\rho$'$t_2$ where $\rho$' is the density of the upper electrode 45, $t_1$ is the thickness of the upper electrode 45a in the resonance portion 47, and $t_2$ is the thickness of the upper electrode 45b in the interconnection portion 48.

As has been described, in order to restrain the quality factor Q from being degraded, the resonance frequency A is higher than the cutoff frequency B, namely, $\omega_A < \omega_B$. The arrangement in which the thickness $t_2$ of the upper electrode 45b in the interconnection portion 48 is smaller than the thickness $t_1$ of the upper electrode 45a in the resonance portion 47 means that M', M'' in equations (1) and (2).

As described above, the first embodiment is capable of improving the quality factor Q by setting the thickness $t_2$ of the upper electrode 45a in the interconnection portion smaller than the thickness t1 of the upper electrode 45b in the resonance portion 47. This is because the mass M" of the upper electrode 45 per unit area in which the upper electrode 45 contacts the piezoelectric film 44 in the interconnection portion 48 is smaller than the mass M' of the upper electrode 45 per unit area in the resonance portion 47. With the above structure, it is possible to restrain vibration energy in the resonance portion 47 from being scattered and lost by employing the simple manufacturing process and prevent degradation of the quality factor Q. The above-mentioned effects are obtained when the per-unit-area mass of a portion of the upper electrode 45a that contacts the piezoelectric film 44 in at least part of the interconnection portion 48 is smaller than that in the resonance portion 47.

Second Embodiment

Figure 11:
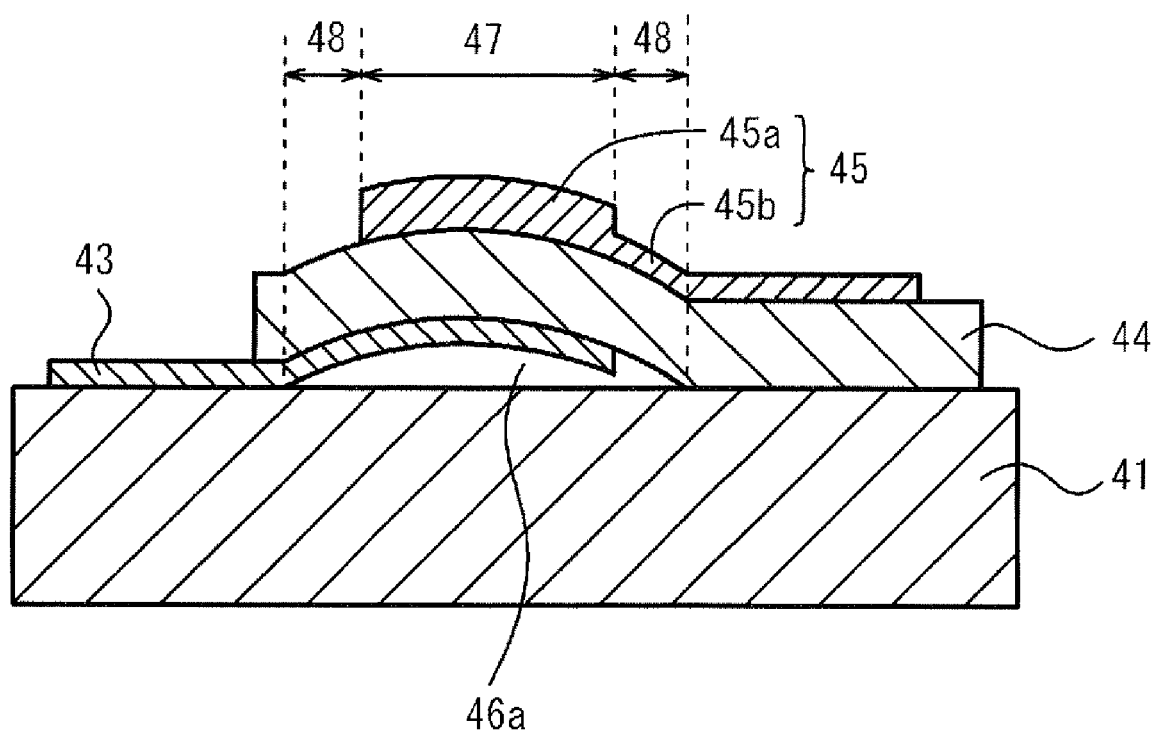
FIG. 11 is a cross-sectional view of a piezoelectric thin-film resonator in accordance with a second embodiment.

Referring to FIG. 11, there is illustrated a cross-sectional view of a piezoelectric thin-film resonator in accordance with a second embodiment. The second embodiment differs from the first embodiment in that the second embodiment does not have the via hole in the silicon substrate. The lower electrode 43 in the resonance portion 47 is formed so that a cavity 46a is formed between the substrate 41 and the lower electrode 43. The cavity 46a is formed into a dome shape. The other structures of the second embodiment are the same as those of the first embodiment shown in part (b) of FIG. 4. According to the second embodiment of the present invention, the per-unit-area mass M" of the upper electrode 45 that is located in the interconnection portion 48 and contacts the piezoelectric film 44 is smaller than the per-unit-area mass M' in the resonance portion 47. It is thus possible to restrain vibration energy of the resonance portion 47 from being scattered and lost.

Third Embodiment

Figure 12:
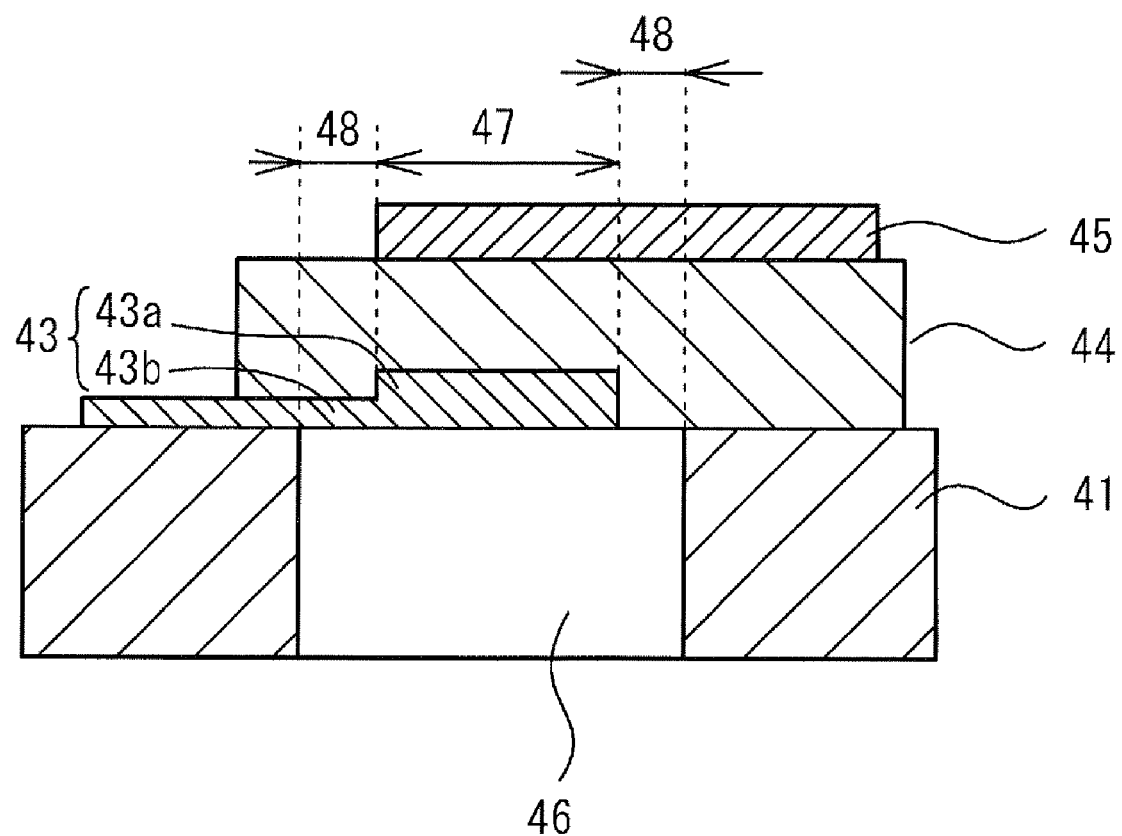
FIG. 12 is a cross-sectional view of a piezoelectric thin-film resonator in accordance with a third embodiment.

Referring to FIG. 12, there is illustrated a cross-sectional view of a piezoelectric thin-film resonator in accordance with a third embodiment. The upper electrode 45 has an even thickness in the resonance portion 47 and the interconnection portion 48. The thickness of a portion 43b of the lower electrode 43 in the interconnection portion 48 is smaller than that of a portion 43a thereof in the resonance portion 47. The other structures of the third embodiment are the same those of the first embodiment. The scattering and losing of vibration energy in the resonance portion 47 can be prevented when the mass M" of the lower electrode 43 per unit area in which the lower electrode 43 contacts the piezoelectric film 44 in the interconnection portion 48 is smaller than the mass M' of the lower electrode 43 per unit area in the resonance portion 47.

Fourth Embodiment

Figure 13:
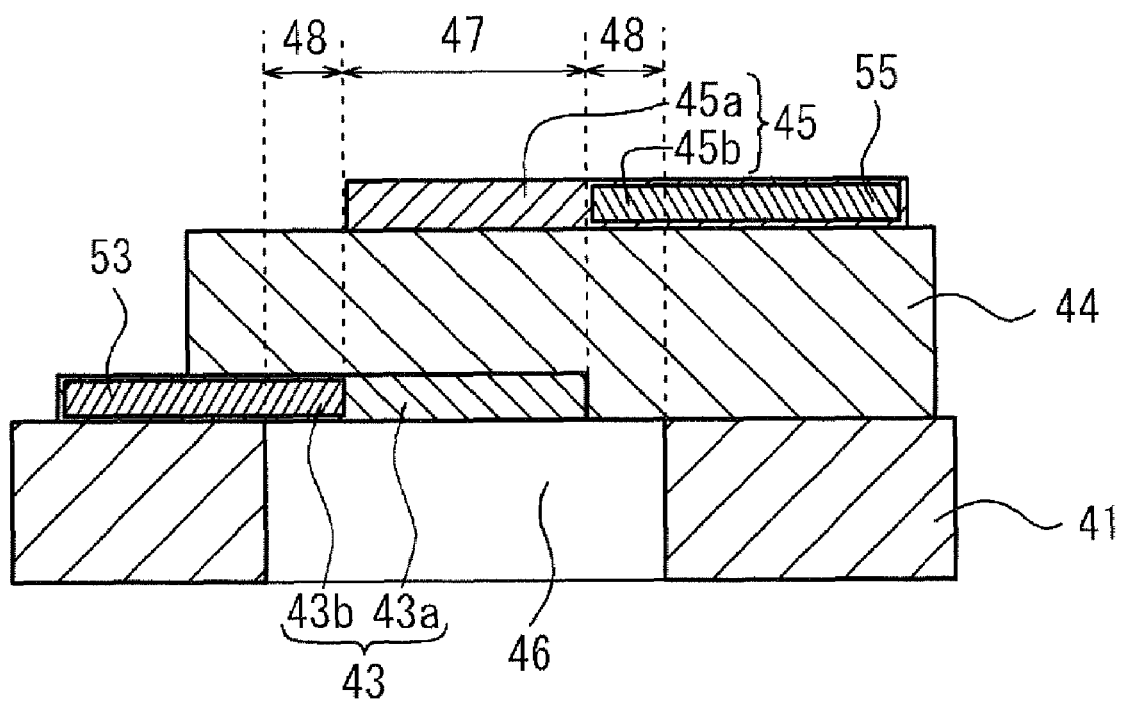
FIG. 13 is a cross-sectional view of a piezoelectric thin-film resonator in accordance with a fourth embodiment.

FIG. 13 is a cross-sectional view of a piezoelectric thin-film resonator in accordance with a fourth embodiment.

The lower electrode 43b in the interconnection portion 48 contains a material 53 having a lower density than that in the resonance portion 47. Similarly, the upper electrode 45b in the interconnection portion 48 contains a material 55 having a lower density than that in the resonance portion 47. The materials 53 and 55 may be, for example, aluminum (Al). The density of at least part of the interconnection portion 48 of at least one of the lower electrode 43 and the upper electrode 45 is lower than the density of the resonance portion 47. Thus, the per-unit-area mass M" of one of the lower electrode 43 and the upper electrode 45 that contacts the piezoelectric film 44 in the involved interconnection portion 48 can be set smaller than the per-unit-area mass M' in the resonance portion 47. It is thus possible to restrain scattering and losing of vibration energy in the resonance portion 47.

Fifth Embodiment

Figure 14:
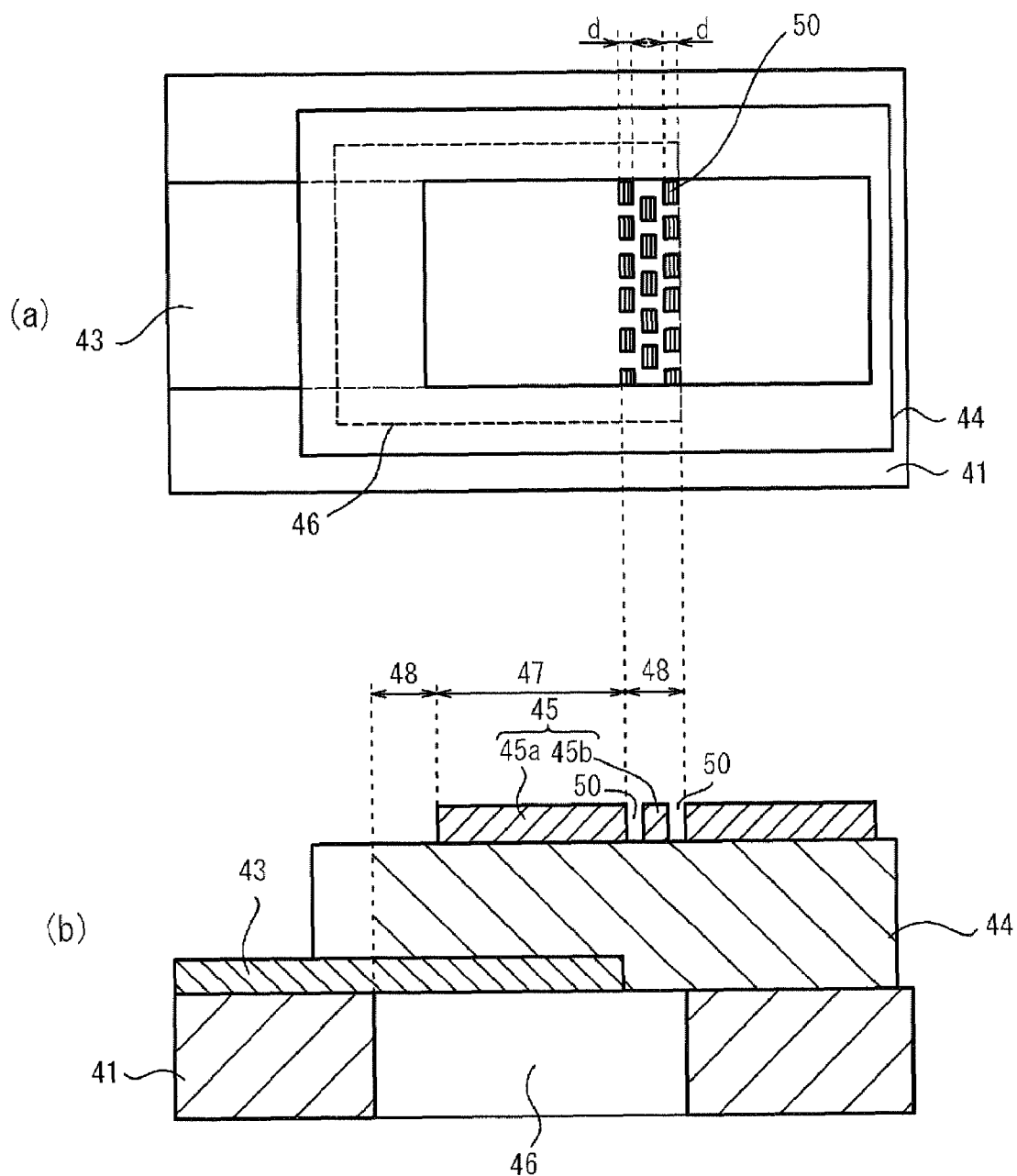
FIG. 14 shows a plan view of a piezoelectric thin-film resonator in accordance with a fifth embodiment in part (a) and a cross-sectional view thereof in part (b)

FIG. 14 has parts (a) and (b), which are respectively plan and cross-sectional views of a piezoelectric thin-film resonator in accordance with a fifth embodiment. The upper electrode 45b has openings 50 in the interconnection portion 48. The openings 50 may be formed in the lower electrode 43b in the interconnection portion 48. The openings 50 formed in at least one of the upper electrode 45b and the lower electrode 43b in the interconnection portions 48 make it possible to set the per-unit-area mass M" of one of the lower electrode 43 and the upper electrode 45 that contacts the piezoelectric film 44 in the involved interconnection portion 48 smaller than the per-unit-area mass M' in the resonance portion 47. It is thus possible to restrain scattering and losing of vibration energy in the resonance portion 47. In case where the size of the openings 50 is less than the wavelength of the excited acoustic wave of the resonance portion 47, the openings 50 may have reduced effects of preventing the mechanical vibrations. Thus, it is preferable to make the size of the openings 50 greater than the wavelength of the acoustic wave.

Sixth Embodiment

Figure 15:
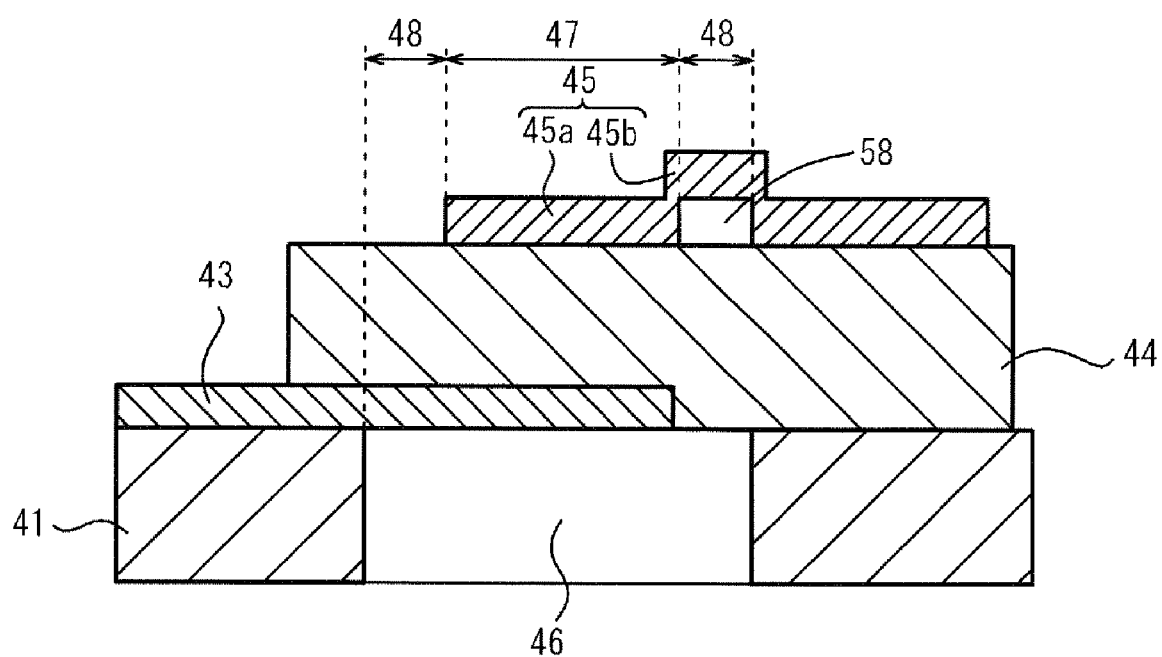
FIG. 15 is a cross-sectional view of a piezoelectric thin-film resonator in accordance with a sixth embodiment.

FIG. 15 is a cross-sectional view of a piezoelectric thin-film resonator in accordance with a sixth embodiment. The upper electrode 45 in the interconnection portion 48 does not contact the piezoelectric film 44. A space 58 is defined between the piezoelectric film 44 and the upper electrode 45. The space 58 may be formed in the lower electrode 43. At least one of the lower electrode 43 and the upper electrode 45 may be formed so as to define the space 58 in cooperation with the piezoelectric film 44 in the interconnection portion 48. Thus, the per-unit-area mass M" of one of the lower electrode 43 and the upper electrode 45 that contacts the piezoelectric film 44 in the involved interconnection portion 48 can be set smaller than the per-unit-area mass M' in the resonance portion 47. It is thus possible to restrain scattering and losing of vibration energy in the resonance portion 47.

In the first through sixth embodiments of the present invention, both the lower electrode 43 and the upper electrode 45 have the interconnection portions 48 that are used to extract the signals from the resonance portion 47 and are located above the via hole 46. At least one of the interconnection portions 48 of the lower electrode 43 and the upper electrode 45 may be formed above the via hole 46. In case where the resonance portion 47 laterally coincides with the via hole 46, the resonance portion 47 may partially overlap the substrate 41 due to the actual precision in forming the lower electrode 43, the upper electrode 45 and the via hole 46. In this case, the vibration of the resonance portion 47 is suppressed and the performance is degraded. Thus, the via hole 46 is preferably formed so as to laterally include the resonance portion 47, That is, the interconnection portions 48 of the lower electrode 43 and the upper electrode 45 are formed above the via hole 46.

It may be considered that the piezoelectric film 44 is not formed in the interconnection portion 48 above the lower electrode 43. However, there is a region in which only the lower electrode 43 is provided above the via hole 46. This may decrease the mechanical strength. Thus, the piezoelectric film 44 is preferably provided above the via hole 46.

In the first through sixth embodiment, the piezoelectric film 44 may be made of aluminum nitride (AlN) or zinc oxide (ZnO) having an orientation of the major axis in the (002) direction. The use of this kind of piezoelectric material contributes improved resonance performance.

Seventh Embodiment

Figure 16A:
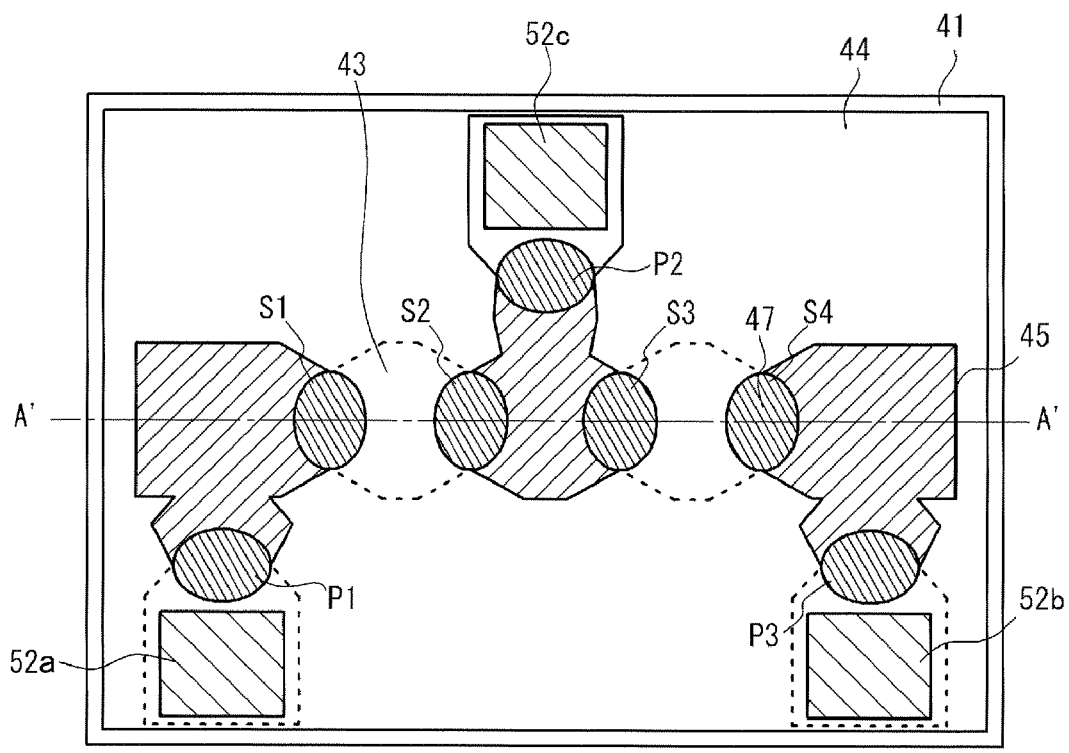
FIG. 16A is a plan view of a filter in accordance with a seventh embodiment.
Figure 16B:
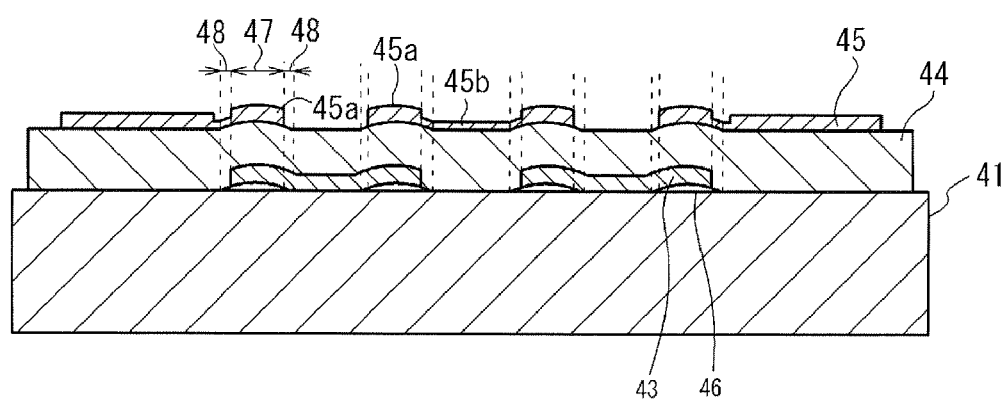
FIG. 16B is a cross-sectional view taken along a line A'-A' shown in FIG. 16A.

A seventh embodiment is a filter composed of multiple piezoelectric thin-film resonators, each being configured in accordance with the second embodiment. FIG. 16A is a plan view of the filter, and FIG. 16B is a cross-sectional view taken along a line A'-A' shown in FIG. 16A. The basic structure of each resonator is as shown in FIG. 13 related to the second embodiment, and the same parts are given the reference numerals. Referring to FIG. 18A, the filter is of ladder type in which series resonators S1 through S4 are connected in series between input/output pads 52a and 52b, and parallel resonators P1 through P3 are connected between given nodes on the transmission line and ground 52c. As shown in FIG. 16B, in each resonator, the upper electrode 45b in the interconnection portion 48 close to the resonance portion 47 is thinner than the upper electrode 45a in the resonance portion 47.

According to the seventh embodiment, the quality factor Q of each piezoelectric thin-film resonator can be prevented from being degraded. Thus, the high-performance filter can be provided. The filter may be made up of resonators configured in accordance with any of the first and third through sixth embodiments. Theoretically, the above-mentioned effects may be brought about by configuring at least one of the resonators of the filter in accordance with any of the first through sixth embodiments. However, most preferably, each resonator of the filter is configured in accordance with any of the first through sixth embodiments. The resonators of the first through sixth embodiments may be applied to another type of filter.

The present invention is not limited to the specifically described embodiments, but other embodiments and variations may be made without departing from the scope of the present invention.

The present application is based of Japanese Patent Application No. 2006-290495, the entire disclosure of which is hereby incorporated by reference.

What is claimed is:

1. A piezoelectric thin-film resonator comprising:
   a lower electrode supported by a substrate, a space being defined below the lower electrode;
   a piezoelectric film provided on the lower electrode and the substrate; and
   an upper electrode provided on the piezoelectric film so as to form a resonance portion in which the upper electrode faces the lower electrode across the piezoelectric film,
   at least one of the lower electrode and the upper electrode having an interconnection portion used to extract a signal from the resonance portion and located above the space,
   said at least one of the lower electrode and the upper electrode having a first mass per unit area in which said at least one of the lower electrode and the upper electrode contacts the piezoelectric film and a second mass per unit area in the resonance portion, the first mass per unit are being smaller than the second mass per unit area,
   wherein said at least one of the lower electrode and the upper electrode has a first density in the interconnection portion and a second density in the resonance portion, the first density that is smaller than the second density.

2. A piezoelectric thin-film resonator comprising:
   a lower electrode supported by a substrate, a space being defined below the lower electrode;
   a piezoelectric film provided on the lower electrode and the substrate; and
   an upper electrode provided on the piezoelectric film so as to form a resonance portion in which the upper electrode faces the lower electrode across the piezoelectric film,
   at least one of the lower electrode and the upper electrode having an interconnection portion used to extract a signal from the resonance portion and located above the space,
   said at least one of the lower electrode and the upper electrode having a first mass per unit area in which said at least one of the lower electrode and the upper electrode contacts the piezoelectric film and a second mass per unit area in the resonance portion, the first mass per unit area being smaller than the second mass per unit area,
   wherein said at least one of the lower electrode and the upper electrode has an opening in the interconnection portion.

3. A piezoelectric thin-film resonator comprising:
   a lower electrode supported by a substrate, a space being defined below the lower electrode;
   a piezoelectric film provided on the lower electrode and the substrate; and
   an upper electrode provided on the piezoelectric film so as to form a resonance portion in which the upper electrode faces the lower electrode across the piezoelectric film,
   at least one of the lower electrode and the upper electrode having an interconnection portion used to extract a signal from the resonance portion and located above the space,
   said at least one of the lower electrode and the upper electrode having a first mass per unit area in which said at least one of the lower electrode and the upper electrode contacts the piezoelectric film and a second mass per unit area in the resonance portion, the first mass per unit area being smaller than the second mass per unit area,
   wherein said at least one of the lower electrode and the upper electrode defines a space in the interconnection portion on the substrate.

4. The piezoelectric thin-film resonator as claimed in claim 1, wherein piezoelectric film is made of AlN or ZnO having an orientation of a major axis in a (002) direction.

5. A filter comprising resonators including a resonator comprising:
   a lower electrode supported by a substrate, a space being defined below the lower electrode;
   a piezoelectric film provided on the lower electrode and the substrate; and an upper electrode provided on the piezoelectric film so as to form a resonance portion in which the upper electrode faces the lower electrode across the piezoelectric film,
   at least one of the lower electrode and the upper electrode having an interconnection portion used to extract a signal from the resonance portion and located above the space,
   said at least one of the lower electrode and the upper electrode having a first mass per unit area in which said at least one of the lower electrode and the upper electrode contacts the piezoelectric film and a second mass per unit area in the resonance portion, the first mass per unit area being smaller than the second mass per unit area
   wherein said at least one of the lower electrode and the upper electrode has a first density in the interconnection portion and a second density in the resonance portion, the first density is smaller than the second density.

6. A filter comprising resonators including a resonator comprising:
   a lower electrode supported by a substrate, a space being defined below the lower electrode;
   a piezoelectric film provided on the lower electrode and the substrate; and
   an upper electrode provided on the piezoelectric film so as to form a resonance portion in which the upper electrode faces the lower electrode across the piezoelectric film,
   at least one of the lower electrode and the upper electrode having an interconnection portion used to extract a signal from the resonance portion and located above the space,
   said at least one of the lower electrode and the upper electrode having a first mass per unit area in which said at least one of the lower electrode and the upper electrode contacts the piezoelectric film and a second mass per unit area in the resonance portion, the first mass per unit area being smaller than the second mass per unit area,
   wherein said at least one of the lower electrode and the upper electrode has an opening in the interconnection portion.

7. A filter comprising resonators including a resonator comprising:
   a lower electrode supported by a substrate, a space being defined below the lower electrode;
   a piezoelectric film provided on the lower electrode and the substrate; and
   an upper electrode provided on the piezoelectric film so as to form a resonance portion in which the upper electrode faces the lower electrode across the piezoelectric film,
   at least one of the lower electrode and the upper electrode having an interconnection portion used to extract a signal from the resonance portion and located above the space,
   said at least one of the lower electrode and the upper electrode having a first mass per unit area in which said at least one of the lower electrode and the upper electrode contacts the piezoelectric film and a second mass per unit area in the resonance portion, the first mass per unit area being smaller than the second mass per unit area,
   wherein said at least one of the lower electrode and the upper electrode defines a space in the interconnection portion on the substrate.

* * * * *

UNITED STATES PATENT AND TRADEMARK OFFICE
CERTIFICATE OF CORRECTION

PATENT NO. : 7,602,101 B2
APPLICATION NO. : 11/976608
DATED : October 13, 2009
INVENTOR(S) : Motoaki Hara et al.

It is certified that error appears in the above-identified patent and that said Letters Patent is hereby corrected as shown below:

Title Page
In (73) Assignee Information, please correct the 1st Assignee's name from:

--FUJITSU MEDIA DEVICES-- to read

--FUJITSU MEDIA DEVICES LIMITED--

Signed and Sealed this

Fourth Day of May, 2010

David J. Kappos
*Director of the United States Patent and Trademark Office*